United States Patent [19]

Vanooteghem et al.

[11] Patent Number: 5,740,489
[45] Date of Patent: Apr. 14, 1998

[54] APPARATUS AND METHOD FOR MAKING A LITHOGRAPHIC PRINTING PLATE ACCORDING TO SILVER SALT DIFFUSION TRANSFER PROCESSING

[75] Inventors: Luc Vanooteghem, Mechlin; Alfons Bertels, Olen, both of Belgium

[73] Assignee: Agfa-Gevaert, Mortsel, Belgium

[21] Appl. No.: 661,793

[22] Filed: Jun. 13, 1996

[30] Foreign Application Priority Data

Jun. 29, 1995 [EP] European Pat. Off. ............ 95201778

[51] Int. Cl.⁶ .................................................. G03D 3/08
[52] U.S. Cl. ...................... 396/617; 355/27; 396/612
[58] Field of Search ............................ 396/612, 617, 396/624, 626, 633, 642, 646, 622, 636; 355/27–29

[56] References Cited

U.S. PATENT DOCUMENTS

| | | | |
|---|---|---|---|
| 4,324,354 | 4/1982 | Hope et al. | 396/612 |
| 5,043,756 | 8/1991 | Takabayashi et al. | 396/616 |
| 5,059,508 | 10/1991 | Vaes et al. | 430/204 |
| 5,116,721 | 5/1992 | Yamamoto | 396/633 |
| 5,455,651 | 10/1995 | Verhoest et al. | 396/617 |
| 5,583,600 | 12/1996 | Kurosawa et al. | 396/622 |

FOREIGN PATENT DOCUMENTS 5-257257  10/1993  Japan ........................... 396/937

*Primary Examiner*—D. Rutledge
*Attorney, Agent, or Firm*—Baker & Botts, L.L.P.

[57] ABSTRACT

An apparatus and a method for making a lithographic printing plate by silver salt diffusion transfer processing, comprising means for informationwise exposing an imaging element (5) comprising on a support in the order given a silver halide emulsion layer and a layer comprising physical development nuclei: means for processing a thus obtained informationwise exposed imaging element using a processor comprising a developing unit (120), the developing unit comprising (i) a tank holding an alkaline processing liquid, (ii) a plurality of guide rollers (50) and guide plates (121 to 126) for transporting and guiding the informationwise exposed imaging element in a transport direction X through the alkaline processing liquid characterised in that at least one of the guide plates (121 to 126) exhibits a plurality of apertures (150) to allow the alkaline processing fluid to pass evenly near the surface of the imaging element.

5 Claims, 3 Drawing Sheets

APPARATUS AND METHOD FOR MAKING A LITHOGRAPHIC PRINTING PLATE ACCORDING TO SILVER SALT DIFFUSION TRANSFER PROCESSING

DESCRIPTION

1. Field of the Invention

The present invention relates to a method for making a lithographic printing plate according to silver salt diffusion transfer processing. In particular, the present invention relates to an improvement of such method involving the use of a processor for processing an informationwise exposed imaging element to a lithographic printing plate.

2. Background of the Invention

The principles of the silver complex diffusion transfer reversal process, hereinafter called DTR-process, have been described e.g. in U.S. Pat. No. 2,352,014 and the book "Photographic Silver Halide Diffusion Processes" by André Rott and Edith Weyde—The Focal Press—London and New York, (1972).

According to the DTR process, a silver complex salt is informationwise transferred by diffusion from the informationwise exposed silver halide emulsion layer into the image receiving layer, where it is converted to a silver image usually in the presence of physical development nuclei. For this purpose, the informationwise exposed silver halide emulsion layer is developed in the presence of a developing agent and non-developed silver halide is converted by means of a silver halide complexing agent into a soluble silver complex salt while in contact with an image receiving layer.

A DTR-image bearing material can be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

In order to prepare a lithographic printing plate from a monosheet DTR imaging element, the imaging element is developed in an alkaline processing liquid subsequent to an informationwise exposure. Such alkaline processing liquid generally comprises as active compounds an inorganic alkali, a hydrophobizing agent, an inorganic sulphite and a silver halide solvent. Optionally, the alkaline processing liquid also comprises a developing agent.

Generally, a thus developed imaging element is stabilised using a stabilising liquid that generally reduces the high pH at the surface of the imaging element. For this purpose, the stabilising liquid will conveniently have a pH between 4 and 7. The stabilising liquid may further include a hydrophobizing agent.

According to a preferred practice, the making of a printing plate is automated using a plate processor that automatically processes an informationwise exposed imaging element. Such processor at least includes a developing unit and preferably also a stabilising unit. An informationwise exposed imaging element is guided and transported through the different units by means of guide rollers and guide plates.

However, it has been found that such automatic processing sometimes results in printing plates exhibiting poor print performances such as unevenness in optical density, non-uniform ink acceptance in particular areas and/or a reduced printing endurance with regard to an expected print endurance. This problem is particularly apparent in case the imaging element is exposed by means of a high intensity short time scanning exposure such as a laser beam exposure, LED exposure or CRT exposure.

OBJECTS OF THE INVENTION

Accordingly, it is an object of the present invention to provide an apparatus and a method for making a lithographic printing plate according to silver salt diffusion transfer processing, wherein the aforementioned problems are resolved.

Further objects of the present invention will become clear from the description hereinafter.

SUMMARY OF THE INVENTION

According to the present invention the objects of the present invention are accomplished by the apparatus and the method as set out in the claims.

BRIEF DESCRIPTION OF THE DRAWINGS

The present invention will be described in more detail making reference to the following drawings, however without the intention to limit the invention thereto.

DETAILED DESCRIPTION OF THE INVENTION

Figure 1:
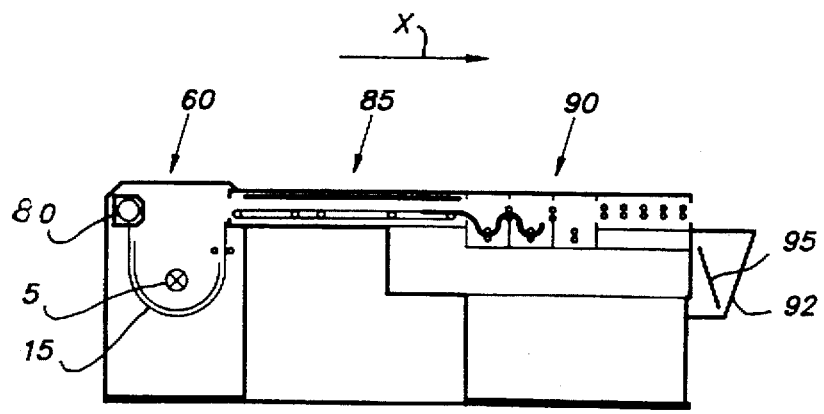
FIG. 1 is a longitudinal section of an imagesetter linked via an external bridge to a processor.

Referring to FIG. 1, an apparatus (such as Agfa ACCUSET or Agfa SELECTSET, both manufactured and marketed by Agfa-Gevaert) includes an exposing part 60 and a processing part 90, disposed side by side and interconnected by an external bridging part 85. Such exposing part preferably is an imagesetter including a high intensity short time scanning exposure unit such as e.g. a laser. Specifically, in the exposing part 60 an imaging element 5, e.g. a photographic film or paper in the form of a roll, is placed in a magazine 80 (e.g. with a 60 meter supply) and positioned at an exposure stage. The photographic material 5 thus exposed with the image is separated into individual images with a cutter (not shown in this drawing), and is fed to the processing part 90. The photographic material thus developed in the processing part 90 is then ejected to a print outlet 92. Numeral 95 denotes photographic prints thus ejected into print outlet 92.

Figure 2:
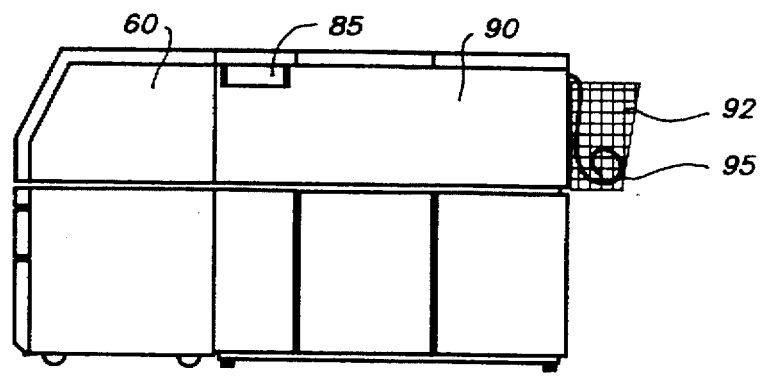
FIG. 2 is a longitudinal view of an imagesetter linked via an internal bridge to a processor.

In addition, FIG. 2 gives a longitudinal view of an imagesetter 60 linked via an internal bridge 85 to a horizontal processor 90, according to e.g. Agfa AVANTRA 44 OLP (available from Agfa-Gevaert). Herein, like reference numerals indicate like parts, so that no explanation has to be duplicated.

As a rule, a processing apparatus for a photographic material or an imaging element 15 comprises several treating units each of which optionally contains a different treatment liquid, such as a developing liquid, a fixing liquid and a rinsing liquid. The imaging element, to be processed is transported through these treating units by the use of one or more pairs of drive rollers, and thereafter to a drying unit. The time spent by the imaging element in each treating unit is determined by the transport speed and the dimensions of the treating unit in the sheet feed path direction.

In order to make the present application as clear as possible, the full description of the imaging element 5 and of the treatment liquid(s) is deferred for some pages. More in particular, first the mechanical characteristics of the present invention will be disclosed; secondly chemical characteristics will be described. Of course, depending on the choice of the actual type of a specific imaging element 5, a suitable chemistry has to be applied, as it will be indicated in experiments relative to SUPERMASTER (e.g. G260 and G360) and to LITHOSTAR (e.g. G5000B and G5300B).

Figure 3:
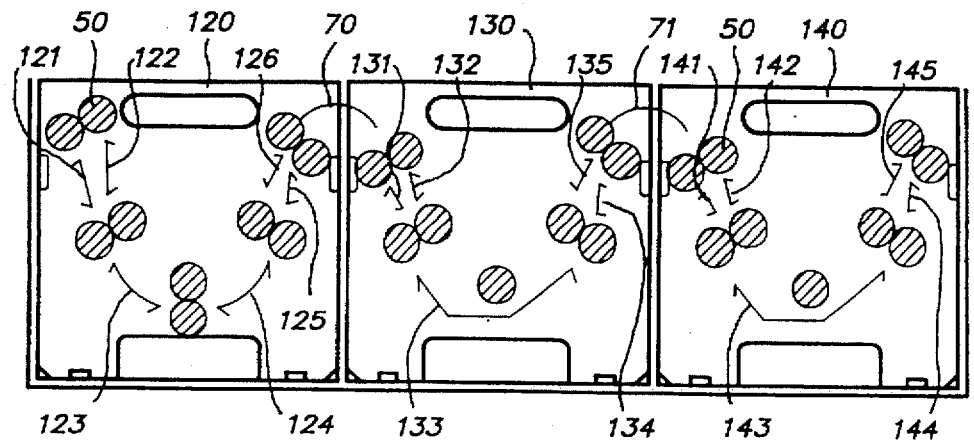
FIG. 3 is a longitudinal section of a processor in accordance with a preferred embodiment of the present invention.

FIG. 3 shows a schematic drawing of a processor in accordance with a particularly preferred embodiment of the present invention. The processor according to FIG. 3 includes a developing unit 120, a stabilising unit 130 and a rinsing unit 140. Each of these units including a plurality of guide rollers such as entrance guide rollers 50 and guide plates 121 to 126, 131 to 135 and 141 to 145 respectively. One or more of the guide rollers are driven by a motor (not shown for sake of greater clarity) so as to transport an informationwise exposed imaging element 5 through the processor.

Guide plates 121 to 126 are used to guide the imaging element through the developing unit whereas guide plates 131 to 135 and 141 to 145 are used to guide the imaging element respectively through the stabilising unit and rinsing unit. Guidance of the imaging element from the developing unit to the stabilising unit is accomplished by a curved plate 70 and a similar curved plate 71 is used for guidance between the stabilising unit and rinsing unit.

In the following paragraphs, additional numerical information will be given relating to further preferred embodiments for making a lithographic printing plate.

Figure 4A:
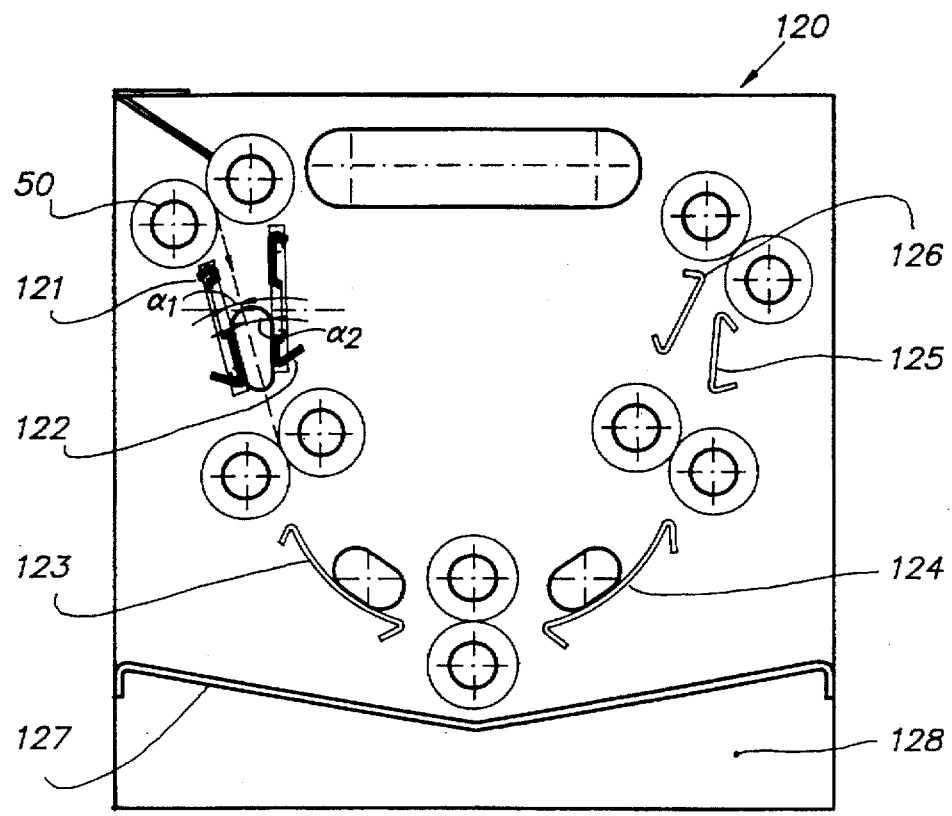
FIGS. 4A and 4B give longitudinal sections of a developing unit of a processor in accordance with the present invention.
Figure 4B:
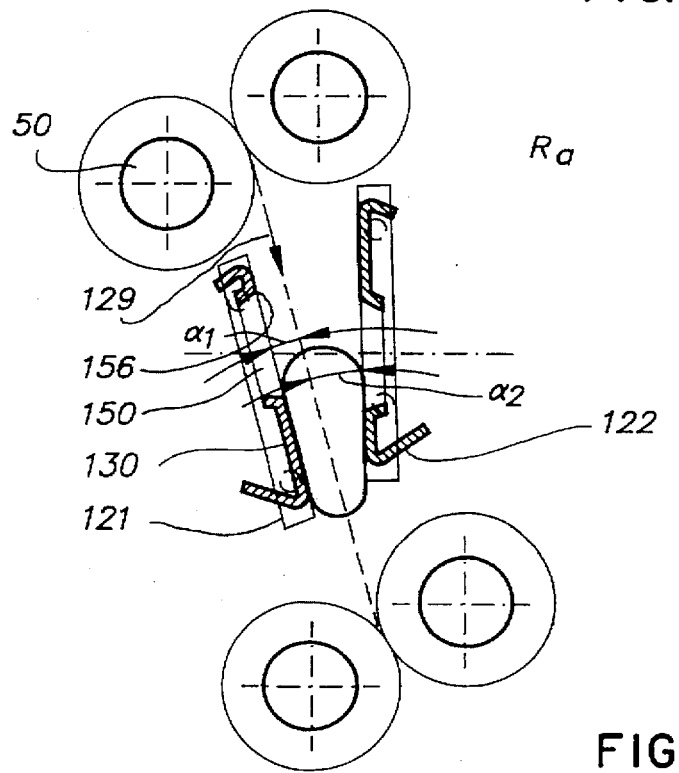

FIG. 4A gives a longitudinal section of a developing unit 120 of a processor in accordance with the present invention; whereas, FIG. 4B gives an enlarged longitudinal section of a developing unit 120 of a processor in accordance with the present invention. Herein, some additional referrals are introduced, as (in numerical order) e.g. 127 which is a bottom plate, 128 which is a side wall, 129 which is the transport direction of the imaging element 5 within the developing unit 120, 130 which is a plurality of opening in side wall 128, 156 which is a collar at the plurality of apertures 150. A further explanation is given in the further description.

Figure 5A:
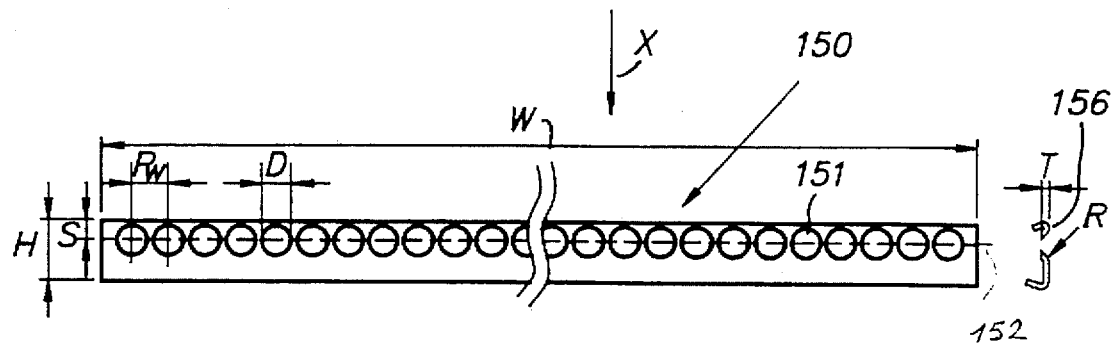
FIGS. 5A, 5B, 5C give schematic views of plurality of apertures in accordance with preferred embodiments of the present invention.
Figure 5B:
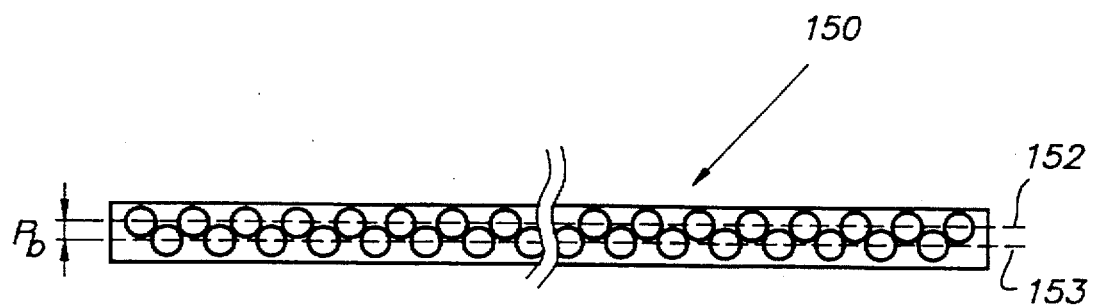
Figure 5C:
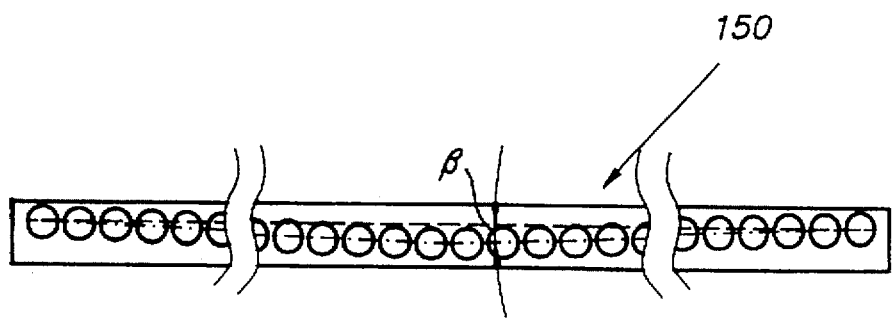

FIGS. 5A to 5C give several schematic views of plurality of apertures 150 in accordance with preferred embodiments of the present invention. Also herein, some additional referrals are introduced, as (in numerical order) e.g. 151 which is a circular aperture, 152 which is a row or a first row of apertures, and 153 which is a second row of apertures. A further explanation is given in the further description.

In accordance with the present invention, it has been found that automatic processing of an informationwise exposed imaging element 5 comprising on a support in the order given a silver halide emulsion layer and a layer comprising physical development nuclei, to a lithographic printing plate with a good printing performance can be accomplished by using an apparatus with a developing unit 120, comprising (i) a tank holding an alkaline processing liquid, (ii) a plurality of guide rollers 50 and guide plates 121–126 for transporting and guiding said informationwise exposed imaging element in a transport direction X through said alkaline processing liquid characterised in that said guide plates 121–126 exhibit a plurality of apertures 150 to allow said alkaline processing fluid to pass evenly near the surface of the imaging element. (It may be remembered once, that the full description of the imaging element 5 and of the treatment liquid or treatment liquids is deferred for some pages; after disclosure of the mechanical aspects of the present application).

In a second embodiment of the present invention, an apparatus for making a lithographic printing plate according to silver salt diffusion transfer processing, comprises:

means for informationwise exposing an imaging element 5 comprising on a support in the order given a silver halide emulsion layer and a layer comprising physical development nuclei;

means for processing a thus obtained informationwise exposed imaging element using a processor comprising a developing unit 120, said developing unit comprising (i) a tank holding an alkaline processing liquid, (ii) a plurality of guide rollers 50 and guide plates 121–126 for transporting and guiding said informationwise exposed imaging element in a transport direction X through said alkaline processing liquid characterised in that said guide plates 121–126 exhibit a plurality of apertures 150 to allow said alkaline processing fluid to pass evenly near the surface of the imaging element.

In a further embodiment of the present invention, an apparatus for making a lithographic printing plate according to silver salt diffusion transfer processing, said means for informationwise exposing is a high-intensity short time scanning exposure or an imagesetter. Informationwise exposure thus may proceed by a scanwise exposure by means of e.g. Cathode Ray Tubes (CRT's), Light Emitting Diodes (LED-'s) or lasers. Examples of lasers that can be used in connection with the present invention are e.g. HeNe lasers, Argon ion lasers, semiconductor lasers, YAG lasers e.g. Nd-YAG lasers etc.

In a further embodiment of the present invention, an apparatus for making a lithographic printing plate, said guide plates are made of a material selected from stainless steel (e.g following DIN 4401), a plastic-coated (e.g. PVC, PA) metal, an electro-coated (galvano-protected) metal, a so-called KTL-protected metal (KTL is a german acronym for "kathodische Tauch Lackierung"), etc.

In a still further preferred embodiment of the present invention, the surface roughness $R_a$ (see FIG. 4B) of the guide plates 121 to 126 (developing unit 120), 131 to 135 (stabilising unit) and 141 to 145 (rinsing unit) is not more than 0.3 μm at the side making contact with the imaging element 5 during transportation of the informationwise exposed imaging element through the developing unit 120. Preferably, guide plates 121 to 126, 131 to 135 and 141 to 145 are made of stainless steel which has been electrolitically polished. However, one or more of the guide plates may be of a different material such as e.g. nickel or chromium plated stainless steel, plastic coated steel such as e.g. steel coated with polyethylene, polypropylene and the like, as long as the surface roughness $R_a$ is not more than 0.3 μm.

In a further embodiment of the present invention, said plurality of apertures 150 comprise circular (see ref. 151 in FIG. 5A), or oval (ellipsoidal), or square or rectangular apertures.

In a further embodiment of the present invention, said plurality of apertures 150 are arranged in at least one row 152 extending transverse to the transport direction X (see FIG. 5A).

In a further embodiment of the present invention, said plurality of apertures 150 are arranged in at least one row 152 extending at an angle β from 1° to 15° to a transverse to the transport direction X (see FIG. 5C).

In a further embodiment of the present invention, said plurality of apertures 150 have an equivalent diametre D between 10 and 25 mm. It may be remarked that in the present application, an equivalent diametre is the diameter when the aperture is a circle; or the square root of the surface area of the aperture when the aperture is not a circle.

In a further embodiment of the present invention, said guide plates have a surface facing the imaging element 5, the apertures occupying between 15% and 45% of the area of the surface.

In a further embodiment of the present invention, said plurality of apertures 150 comprises at least two rows 152, 153 of apertures, with a pitch $P_w$ within a row ranging from 2 to 20 mm (see FIG. 5A) and/or with a pitch $P_b$ between two consecutive rows (152, 153) ranging from 10 to 50 mm (see FIG. 5B).

In a further embodiment of the present invention, said plurality of apertures 150 are formed by press operations (as blanking, piercing, perforating, notching, forcing) or by metal-cutting (as milling, drilling) or by electro-erosion forming.

In a further embodiment, said plurality of apertures 150 comprise a collar with a thickness T between 1 and 5 mm and/or with a radius R between 0.4 and 3 mm (see FIG. 5A).

In a further embodiment of the present invention, said guide plate is an inclined guide plate 121, 122 with an angle α (respectively $α_1$, $α_2$) to the transport direction 129, wherein the angle is comprised between 2° and 25° (see FIG. 4B).

In a further embodiment of the present invention, additionally also at least one side wall 128 of the developing unit 120 comprises a plurality of openings 130 (see FIGS. 4A and 4B).

In a still further preferred embodiment, said processor further includes a rinsing unit comprising a tank holding a rinsing liquid, a plurality of guide rollers 50 and guide plates 141 to 145, the guide plates 141 to 145 exhibiting a surface roughness $R_a$ of 0.3 μm or less at the side of the guide plates 141 to 145 making contact with the informationwise exposed imaging element during transportation of the informationwise exposed imaging element through the rinsing unit.

Further, also included within the scope of the present invention is an apparatus for making an offset printing plate according to the silver salt diffusion transfer process comprising:

means for informationwise exposing an imaging element (5) comprising in the order given (i) a hydrophilic base, (ii) an image receiving layer containing physical development nuclei and (iii) a silver halide emulsion layer, means for developing said informationwise exposed imaging element using an aqueous alkaline processing solution in the presence of at least one developing agent and at least one silver halide solvent to obtain a silver image on said hydrophilic support and means for removing said silver halide emulsion layer and any optional layer on top of said silver image to expose said silver image by means of washing with rinsing water, characterized in that said washing is carried out by means of at least two consecutive rinsing units cascaded in series.

Also included in the present invention is a method for making a lithographic printing plate according to silver salt diffusion transfer processing, said method comprising the steps of:

informationwise exposing an imaging element (5) comprising on a support in the order given a silver halide emulsion layer and a layer comprising physical development nuclei;

processing a thus obtained informationwise exposed imaging element using a processor comprising a developing unit 120, said developing unit comprising (i) a tank holding an alkaline processing liquid, (ii) a plurality of guide rollers (50) and guide plates (121 to 126) for transporting and guiding said informationwise exposed imaging element through said alkaline processing liquid characterised in that said guide plates (121 to 126) exhibit a plurality of apertures 150 to allow said alkaline processing fluid to pass evenly near the surface of said imaging element.

In a further embodiment of a method according the present invention, said processor further includes a stabilising unit comprising a tank holding a stabilising liquid, a plurality of guide rollers 50 and guide plates 131 to 135, the guide plates 131 to 135 exhibiting a surface roughness $R_a$ of 0.3 μm or less at the side of the guide plates 131 to 135 making contact with the informationwise exposed imaging element during transportation of the informationwise exposed imaging element through the stabilising unit.

In a further embodiment of the present invention, a method for making a lithographic printing plate according to silver salt diffusion transfer processing, comprises a further step of washing the silver image with rinsing water, wherein the washing is carried out by means of at least two consecutive rinsing units cascaded in series.

In still another preferred embodiment of the present invention, the method further comprises a finishing step for treating the processed imaging element 5 with a finisher to make the image areas oleophilic (ink-receptive) and non-image areas more oleophobic (ink-repellant).

Up to here, mainly the mechanical characteristics of the present invention have been disclosed. In the next paragraphs, the chemical characteristics will be described.

Informationwise exposure in accordance with the present invention may proceed by a scanwise exposure by means of e.g. a laser directly according to said screened data on a printing plate precursor (socalled computer to plate) or it may be performed by first exposing according to the screened data an intermediate photographic film of high contrast, generally a high contrast silver halide film, and then using the imaged photographic film as a mask for exposing a lithographic printing plate precursor to a conventional light source in a camera exposure or contact exposure. An example of such an intermediate photographic film (as imaging element) is marketed by Agfa-Gevaert under the name AGFASTAR.

Examples of photosensitive lithographic imaging elements 5 are, for example, the silver salt diffusion transfer (generally referred to as DTR) materials disclosed in EP-A-410500, EP-A-483415, EP-A-423399, imaging elements having a photosensitive layer containing diazonium salts or a diazo resin as described for example in EP-A-450199, and imaging elements having a photosensitive layer containing a photopolymerizable composition as described for example in EP-A-502562, EP-A-491457, EP-A-503602, EP-A-471483 and DE-A-4102173.

One type of mono-sheet DTR material comprises on a support in the order given a silver halide emulsion layer and an image receiving layer containing physical development nuclei e.g. a heavy metal sulphide such as PdS. The image receiving layer is preferably free of binder or contains a hydrophilic binder in an amount of not more than 30% by weight. Subsequent to informationwise exposure, the mono-sheet DTR material is developed using an alkaline processing liquid in the presence of developing agents e.g. of the hydroquinone type and/or pyrazolidone type and a silver halide solvent such as e.g. a thiocyanate. Subsequently, the plate surface is stabilised or neutralised with a stabilising liquid. Details about the constitution of this type of mono-sheet DTR material and suitable processing liquids can be found in e.g. EP-A-423399, U.S. Pat. No. 4,501,811, and U.S. Pat. No. 4,784,933. Lithographic printing plate precursors of this type are marketed by Agfa-Gevaert under the names SETPRINT and SUPERMASTER.

The inventors have conducted an experiment with commercially available imaging elements SUPERMASTER comprising on a support in the order given an anti-halation layer, a silver halide emulsion layer and a physical development nuclei layer were informationwise exposed. Thus obtained informationwise exposed imaging elements were then processed in a processor wherein the developing unit 120 contained as an alkaline processing liquid G260, the stabilising or neutralising unit contained as a stabilising liquid G360 (all commercially available from Agfa-Gevaert) and the rinsing unit contained plain water as a rinsing liquid.

A second process for obtaining a lithographic printing plate by means of a DTR process uses an imaging element 5 comprising, in the order given, a support with a hydrophilic surface such as a grained and anodized aluminium foil, a layer of physical development nuclei and a silver halide emulsion layer. An example of such an imaging element is marketed by Agfa-Gevaert under the name LITHOSTAR. The imaging element of the present embodiment is imaged using a scanning exposure followed by a development step in the presence of development agent(s) and silver halide solvent(s) so that a silver image is formed in the physical development nuclei layer. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents. More technical details about the development may be found in e.g. EP-A-93.201.305.5 and U.S. Ser. No. 08/303,670 now U.S. Pat. No. 5,481,328 (both in the name of Agfa-Gevaert).

The present inventors have run an experiment, wherein a commercially available silver salt diffusion transfer lithographic printing plate LITHOSTAR LAP-B was informationwise exposed with screened cyan, magenta, yellow and black separations of a color image. Thereafter, the imaging element was subsequently developed using the processing liquid G5000B and the finishing liquid G5300B, each available from Agfa-Gevaert.

It will be understood that the description and specific examples, while indicating preferred embodiments, are given by way of non-restrictive illustration only. Therabove, vareous modifications will become possible for those skilled in the art after receiving the teachings of the present disclosure without departing from the scope thereof.

Whereas the processor mainly has been described with reference to an exposing part comprising an electronic imagesetter, it is self-speaking that optionally also a conventional camera may be used.

It may be emphasized that the imaging element can have the form of separate sheets (cfr. SUPERMASTER; see also FIG. 1) or can have the form of a roll or web (cfr. SELECTSET; see also FIG. 2). Therabove the imaging element can be perforated or not, e.g. because of registering accuracy of different colour selections.

For people skilled in the art, it may be evident that in a preferred embodiment of the present invention, the apparatus further comprises driving means (not shown for sake of clarity) for catching the imaging element 5 and guiding the imaging element.

Evidently, one or more of the treating units of the apparatus may include additional features if desired. Thus, cleaning means may be provided for acting upon the rollers to remove debris therefrom, as described in EP-A-93.202.862.4 (in the name of Agfa-Gevaert). Additional roller pairs may be provided for transporting the imaging element through the apparatus. Guide means may be included for guiding the passage of the imaging element through the apparatus. Evidently, also heating means may be provided. Any combination of these additional features is also possible.

It is a further great advantage of the present invention that it may be used in different technical fields of applications. For example, but non-limitative to the scope of protection, it may be used in embodiments for making a lithographic printing plate using an intermediate photographic film (cfr. AGFASTAR), using a camera exposure directly on a printing paper or film (cfr. SUPERMASTER), using a computer directly on paper or film (cfr. SETPRINT), or using a computer directly on an aluminium plate (cfr. LITHOSTAR); etc.

While presently preferred embodiments have been described in detail, as will be apparent with those familiar with the art, certain changes and modifications still can be made without departing from the spirit and scope of the invention as defined by the following claims.

We claim:

1. An apparatus for processing an imaging element; said apparatus comprising a developing unit comprising a tank for holding a processing liquid, and a plurality of guide rollers and guide plates for transporting and guiding said imaging element in a transport direction X through said processing liquid, at least one pair of said guide plates being situated at the entrance of the developing unit and each of said guide plates exhibiting a plurality of apertures, having an equivalent diameter D between 10 and 25 mm, to allow said processing fluid to pass evenly near the surface of the imaging element, said guide plates exhibiting a surface roughness $R_a$ of 0.3 μm or less at the side of said guide plates making contact with said imaging element during transportation of said imaging element through said developing unit.

2. An apparatus for processing an imaging element; said apparatus comprising a developing unit comprising a tank for holding a processing liquid, and a plurality of guide rollers and guide plates for transporting and guiding said imaging element in a transport direction X through said alkaline processing liquid, at least one pair of said guide plates being situated at the entrance of the developing unit and each of said guide plates exhibiting a plurality of apertures, comprising at least two rows of apertures, with a pitch $P_w$ within a row ranging from 2 to 20 mm, to allow said processing fluid to pass evenly near the surface of the imaging element, said guide plates exhibiting a surface roughness $R_a$ of 0.3 μm or less at the side of said guide plates making contact with said imaging element during transportation of said imaging element through said developing unit.

3. An apparatus for processing an imaging element; said apparatus comprising a developing unit comprising a tank for holding a processing liquid, and a plurality of guide rollers and guide plates for transporting and guiding said imaging element in a transport direction X through said processing liquid, at least one pair of said guide plates being situated at the entrance of the developing unit and each of said guide plates exhibiting a plurality of apertures, comprising at least two rows of apertures, with a pitch $P_b$ between two consecutive rows ranging from 10 to 50 mm, to allow said processing fluid to pass evenly near the surface of the imaging element, said guide plates exhibiting a surface roughness $R_a$ of 0.3 µm or less at the side of said guide plates making contact with said imaging element during transportation of said imaging element through said developing unit.

4. An apparatus for processing an imaging element; said apparatus comprising a developing unit comprising a tank for holding a processing liquid, and a plurality of guide rollers and guide plates for transporting and guiding said imaging element in a transport direction X through said processing liquid, at least one pair of said guide plates being situated at the entrance of the developing unit and each of said guide plates exhibiting a plurality of apertures, comprising a collar with a thickness T between 1 and 5 mm, to allow said processing fluid to pass evenly near the surface of the imaging element, said guide plates exhibiting a surface roughness $R_a$ of 0.3 µm or less at the side of said guide plates making contact with said imaging element during transportation of said imaging element through said developing unit.

5. An apparatus for processing an imaging element; said apparatus comprising a developing unit comprising a tank for holding a processing liquid, and a plurality of guide rollers and guide plates for transporting and guiding said imaging element in a transport direction X through said processing liquid, at least one pair of said guide plates being situated at the entrance of the developing unit and each of said guide plates exhibiting a plurality of apertures, comprising a collar with a radius R between 0.4 and 3.5 mm, to allow said processing fluid to pass evenly near the surface of the imaging element, said guide plates exhibiting a surface roughness $R_a$ of 0.3 µm or less at the side of said guide plates making contact with said imaging element during transportation of said imaging element through said developing unit.

* * * * *